(12) United States Patent
Carter et al.

(10) Patent No.: US 9,546,826 B1
(45) Date of Patent: Jan. 17, 2017

(54) MICROTRUSS BASED THERMAL HEAT SPREADING STRUCTURES

(75) Inventors: William B. Carter, Woodland Hills, CA (US); Adam F. Gross, Santa Monica, CA (US); Keith V. Guinn, Thousand Oaks, CA (US); Alan J. Jacobsen, Woodland Hills, CA (US); David Kisailus, Riverside, CA (US)

(73) Assignee: HRL Laboratories, LLC, Malibu, CA (US)

(*) Notice: Subject to any disclaimer, the term of this patent is extended or adjusted under 35 U.S.C. 154(b) by 964 days.

(21) Appl. No.: 12/691,393

(22) Filed: Jan. 21, 2010

(51) Int. Cl.
*F28D 15/00* (2006.01)
*F28D 15/04* (2006.01)
*F28D 15/02* (2006.01)

(52) U.S. Cl.
CPC ............ *F28D 15/046* (2013.01); *F28D 15/02* (2013.01)

(58) Field of Classification Search
CPC .... F28D 15/046; F28D 15/0233; F28D 15/04; F28D 15/043; H01L 23/427; H01L 23/3672; F28F 3/02; B23P 15/26
USPC .......... 165/104.26, 104.21, 185; 29/890.032; 428/116, 304.4, 608
See application file for complete search history.

(56) References Cited

U.S. PATENT DOCUMENTS

| | | |
|---|---|---|
| 3,446,593 A | 5/1969 | Moutaud et al. |
| 3,820,596 A * | 6/1974 | Weinhardt ............ 165/104.26 |
| 3,829,740 A | 8/1974 | Beasley |
| 3,834,457 A * | 9/1974 | Madsen ................ 165/104.26 |
| 3,882,934 A | 5/1975 | Knoos et al. |
| 3,893,506 A | 7/1975 | Laing |
| 3,984,861 A | 10/1976 | Kessler, Jr. |
| 4,022,875 A | 5/1977 | Vinton et al. |
| 4,042,757 A | 8/1977 | Jones |
| 4,220,195 A | 9/1980 | Borgoyn et al. |
| 4,327,801 A | 5/1982 | Koizumi et al. |
| 4,344,479 A | 8/1982 | Bailey |
| 4,419,302 A | 12/1983 | Nishino et al. |
| 4,531,511 A | 7/1985 | Hochberg |
| 4,602,679 A | 7/1986 | Edelstein |
| 5,031,401 A | 7/1991 | Hinderks |
| 5,165,243 A | 11/1992 | Bennett |
| 5,248,079 A | 9/1993 | Li |
| 5,343,358 A | 8/1994 | Hilbrink |
| 5,402,004 A | 3/1995 | Ozmat |
| 5,674,572 A | 10/1997 | Sarin et al. |
| 5,719,444 A | 2/1998 | Tilton et al. |
| 5,761,037 A | 6/1998 | Anderson et al. |
| 5,830,548 A | 11/1998 | Andersen et al. |

(Continued)

FOREIGN PATENT DOCUMENTS

| | | |
|---|---|---|
| WO | WO8304408 A1 | 12/1983 |
| WO | 01/92001 A1 | 12/2001 |
| WO | 02/06747 A1 | 1/2002 |

OTHER PUBLICATIONS

H.N.G. Wadley et al., Fabrication and structural performance of periodic cellular metal sandwich structures, Composites Science and Technology, 2003, 2331-2343, 63.

(Continued)

*Primary Examiner* — Travis Ruby
(74) *Attorney, Agent, or Firm* — Christopher R. Balzan

(57) ABSTRACT

A heat transport structure is provided having a structural microtruss wick with a thermal transport medium associated with the microtruss wick for thermal energy transport by fluid and vapor transport between a heat source and a heat sink.

31 Claims, 6 Drawing Sheets

(56) References Cited

U.S. PATENT DOCUMENTS

| | | | |
|---|---|---|---|
| 5,916,505 | A | 6/1999 | Cisar et al. |
| 5,972,196 | A | 10/1999 | Murphy et al. |
| 6,146,779 | A | 11/2000 | Walsh |
| 6,149,810 | A | 11/2000 | Gonzalez-Martin et al. |
| 6,205,022 | B1 | 3/2001 | Bhatia et al. |
| 6,209,200 | B1 | 4/2001 | Campbell |
| 6,266,997 | B1 | 7/2001 | Nelson |
| 6,274,288 | B1 | 8/2001 | Kewitsch et al. |
| 6,293,332 | B2 | 9/2001 | Li |
| 6,341,491 | B1 | 1/2002 | Paine et al. |
| 6,475,654 | B1 | 11/2002 | Bliesner |
| 6,666,909 | B1 | 12/2003 | TeGrotenhuis et al. |
| 6,667,017 | B2 | 12/2003 | Murrell et al. |
| 6,733,913 | B2 | 5/2004 | Cisar et al. |
| 6,749,931 | B1 | 6/2004 | Pinneo et al. |
| 6,760,222 | B1 | 7/2004 | Wang |
| 6,815,052 | B2 | 11/2004 | Pinneo |
| 6,868,898 | B2 | 3/2005 | Chau |
| 6,888,720 | B2 | 5/2005 | Pfister |
| 6,987,318 | B2 | 1/2006 | Sung |
| 7,095,111 | B2 | 8/2006 | Hu et al. |
| 7,288,326 | B2 | 10/2007 | Elzey et al. |
| 7,360,581 | B2 | 4/2008 | Tuma |
| 7,382,959 | B1 | 6/2008 | Jacobsen |
| 7,401,643 | B2 | 7/2008 | Queheillalt et al. |
| 7,424,967 | B2 | 9/2008 | Ervin et al. |
| 7,616,444 | B2 | 11/2009 | Munch et al. |
| 7,645,512 | B1 | 1/2010 | Sammakia et al. |
| 7,653,276 | B1 | 1/2010 | Gross et al. |
| 7,653,279 | B1 | 1/2010 | Jacobsen |
| 7,687,132 | B1 | 3/2010 | Gross et al. |
| 7,694,725 | B2 | 4/2010 | Chang |
| 7,913,611 | B2 | 3/2011 | Terry et al. |
| 7,938,989 | B1 | 5/2011 | Gross et al. |
| 7,943,263 | B2 | 5/2011 | Brantley et al. |
| 8,017,193 | B1 | 9/2011 | Zhou et al. |
| 8,114,544 | B1 | 2/2012 | Salguero et al. |
| 8,155,496 | B1 | 4/2012 | Cumberland et al. |
| 8,195,023 | B1 | 6/2012 | Jacobsen et al. |
| 8,197,930 | B1 | 6/2012 | Jacobsen et al. |
| 8,247,333 | B2 | 8/2012 | Sypeck et al. |
| 8,272,309 | B1 | 9/2012 | Cumberland et al. |
| 8,320,727 | B1 | 11/2012 | Jacobsen et al. |
| 8,322,332 | B2 | 12/2012 | Rogers |
| 8,353,240 | B1 | 1/2013 | Schaedler et al. |
| 8,435,438 | B1 | 5/2013 | Gross et al. |
| 8,453,717 | B1 | 6/2013 | Roper et al. |
| 8,573,289 | B1 | 11/2013 | Roper et al. |
| 8,579,018 | B1 | 11/2013 | Roper et al. |
| 8,585,944 | B1 | 11/2013 | Jacobsen |
| 8,921,702 | B1 | 12/2014 | Carter et al. |
| 9,086,229 | B1 | 7/2015 | Roper et al. |
| 9,229,162 | B1 | 1/2016 | Roper et al. |
| 2002/0020518 | A1 | 2/2002 | Li |
| 2002/0056908 | A1 | 5/2002 | Brownell et al. |
| 2003/0135181 | A1 | 7/2003 | Chen et al. |
| 2003/0180205 | A1 | 9/2003 | Carlborg et al. |
| 2004/0123980 | A1* | 7/2004 | Queheillalt et al. ......... 165/133 |
| 2004/0136101 | A1 | 7/2004 | Warren |
| 2004/0244951 | A1 | 12/2004 | Dussinger et al. |
| 2005/0141197 | A1 | 6/2005 | Ertuk et al. |
| 2005/0202206 | A1 | 9/2005 | Wadley |
| 2005/0205242 | A1 | 9/2005 | Chien |
| 2005/0205243 | A1 | 9/2005 | Rosenfeld et al. |
| 2005/0217826 | A1 | 10/2005 | Dussinger et al. |
| 2006/0005960 | A1 | 1/2006 | Hsu |
| 2006/0129015 | A1 | 6/2006 | Tonkovich et al. |
| 2006/0162907 | A1 | 7/2006 | Wu |
| 2006/0181794 | A1 | 8/2006 | Warren |
| 2006/0194092 | A1 | 8/2006 | Kanai et al. |
| 2007/0036896 | A1 | 2/2007 | Sung et al. |
| 2007/0068654 | A1 | 3/2007 | Chang |
| 2007/0068656 | A1 | 3/2007 | Lee et al. |
| 2007/0095507 | A1 | 5/2007 | Henderson et al. |
| 2007/0102140 | A1 | 5/2007 | Tuma |
| 2007/0107875 | A1 | 5/2007 | Lee |
| 2007/0163755 | A1 | 7/2007 | Kim |
| 2007/0234894 | A1 | 10/2007 | Lucuta et al. |
| 2008/0121475 | A1 | 5/2008 | Bhaskara |
| 2008/0128898 | A1 | 6/2008 | Henderson et al. |
| 2008/0135095 | A1 | 6/2008 | Cummings et al. |
| 2008/0226870 | A1 | 9/2008 | Sypeck et al. |
| 2008/0253085 | A1 | 10/2008 | Soffer |
| 2009/0151923 | A1 | 6/2009 | Fedorov |
| 2009/0211735 | A1 | 8/2009 | Stenkamp et al. |
| 2009/0212575 | A1 | 8/2009 | Larsen et al. |
| 2009/0321053 | A1 | 12/2009 | Tegrotenhuis et al. |
| 2010/0155033 | A1 | 6/2010 | Holley et al. |
| 2010/0159398 | A1 | 6/2010 | Rock |
| 2010/0326644 | A1 | 12/2010 | Hung et al. |

OTHER PUBLICATIONS

A.G. Evans et al., Multifuctionality of cellular metal systems, Progress in Materials Science, 1999, 171-221, 43.

A.G. Evans, Lightweight Materials and Structures, MRS Bulletin, Oct. 2001, 790-797.

Christopher S. Roper et al., U.S. Appl. No. 12/506,014, Title: Micro-architected materials for heat exchanger applications, filed Jul. 20, 2009.

Christopher S. Roper et al., U.S. Appl. No. 12/383,378, Title: Lightweight sandwich panel heat pipe, filed Mar. 23, 2009.

Jacobsen et al., U.S. Appl. No. 12/317,210, Title: Functionally-Graded Three Dimensional Ordered Open-Cellular Microstructure and Method of Making Same, filed Dec. 18, 2008.

Kishner, et al., Large stable mirrors: a comparison of glass, beryllium and silicon carbide,1990, p. 127-139, SPIE vol. 1335, Dimensional Stability.

Fortini, Arthur J., Open-cell silicon foam for ultralightweight mirrors, SPIE Conference on Optomechanical Design and Engineering, Jul. 1999, p. 440-446, SPIE vol. 3786, Denver, Colorado.

Jacobsen et al., U.S. Appl. No. 12/008,479, Title: Composite structures with ordered three-dimensional (3D) continuous interpenetrating phases, filed Jan. 11, 2008.

Roper et al., U.S. Appl. No. 12/505,980, Title: Micro-architected materials for heat sink applications, filed Jul. 20, 2009.

Gross et al., U.S. Appl. No. 12/075,033, Title: Composite structures for storing thermal energy, filed Mar. 6, 2008.

Carter et al., U.S. Appl. No. 12/691,322, Title: Microtruss based thermal plane structures and microelectronics and printed wiring board embodiments, filed Jan. 21, 2010.

USPTO Non-Final Office Action mailed Feb. 17, 2012, for U.S. Appl. No. 12/691,322, filed Jan. 21, 2010, Inventor William Carter.

Response filed Jul. 17, 2012 to USPTO Non-Final Office Action mailed Feb. 17, 2012, for U.S. Appl. No. 12/691,322, filed Jan. 21, 2010, Inventor William Carter.

USPTO Final Office Action mailed Aug. 3, 2012, for U.S. Appl. No. 12/691,322, filed Jan. 21, 2010, Inventor William Carter.

Response filed Dec. 3, 2012 to USPTO Final Office Action mailed Aug. 3, 2012, for U.S. Appl. No. 12/691,322, filed Jan. 21, 2010, Inventor William Carter.

USPTO Non-Final Office Action mailed Jan. 17, 2013, for U.S. Appl. No. 12/691,322, filed Jan. 21, 2010, Inventor William Carter.

Response filed Jun. 17, 2013 to USPTO Non-Final Office Action mailed Jan. 17, 2013, for U.S. Appl. No. 12/691,322, filed Jan. 21, 2010, Inventor William Carter.

USPTO Final Office Action mailed Jul. 9, 2013, for U.S. Appl. No. 12/691,322, filed Jan. 21, 2010, Inventor William Carter.

Response filed Nov. 12, 2013 to USPTO Final Office Action mailed Jul. 9, 2013, for U.S. Appl. No. 12/691,322, filed Jan. 21, 2010, Inventor William Carter.

USPTO Final Office Action mailed Nov. 18, 2013, for U.S. Appl. No. 12/691,322, filed Jan. 21, 2010, Inventor William Carter.

Response filed Mar. 20, 2014 to USPTO Final Office Action mailed Nov. 18, 2013, for U.S. Appl. No. 12/691,322, filed Jan. 21, 2010, Inventor William Carter.

Jacobsen et al., U.S. Appl. No. 12/455,449, Title: Micro-Truss based energy absorption apparatus, filed Jun. 1, 2009.

(56) References Cited

OTHER PUBLICATIONS

Zhou et al., U.S. Appl. No. 12/506,859, Title: Pre-ceramic monomer formulations for making polymer waveguides, filed Jul. 21, 2009.
Christopher S. Roper et al., U.S. Appl. No. 13/017,704, Title: Three-dimensional ordered diamond cellular structures and method of making the same, filed Jan. 31, 2011.
Supplemental Amendment (Suppl_Amndnt) filed Oct. 29, 2012, for U.S. Appl. No. 13/017,704, Title: Three-dimensional ordered diamond cellular structures and method of making the same, filed Jan. 31, 2011, Inventor Christopher S. Roper et al.
USPTO Non-Final Office Action (NFOA01) mailed Dec. 11, 2012, for U.S. Appl. No. 13/017,704 Title: Three-dimensional ordered diamond cellular structures and method of making the same, filed Jan. 31, 2011, Inventor Christopher S. Roper et al.
Response filed May 13, 2013 to Non-Final Office Action (R-NFOA01) mailed Dec. 11, 2012, for U.S. Appl. No. 13/017,704 Title: Three-dimensional ordered diamond cellular structures and method of making the same, filed Jan. 31, 2011, Inventor Christopher S. Roper et al.
USPTO Non-Final Office Action (NFOA02) mailed Jul. 2, 2013, for U.S. Appl. No. 13/017,704 Title: Three-dimensional ordered diamond cellular structures and method of making the same, filed Jan. 31, 2011, Inventor Christopher S. Roper et al.
Response filed Nov. 4, 2013 to USPTO Non-Final Office Action (R-NFOA02) mailed Jul. 2, 2013, for U.S. Appl. No. 13/017,704 Title: Three-dimensional ordered diamond cellular structures and method of making the same, filed Jan. 31, 2011, Inventor Christopher S. Roper et al.
USPTO Final Office Action (FOA) mailed Jan. 7, 2014, for U.S. Appl. No. 13/017,704 Title: Three-dimensional ordered diamond cellular structures and method of making the same, filed Jan. 31, 2011, Inventor Christopher S. Roper et al.
Response filed Apr. 11, 2014 to USPTO Final Office Action (1_116_R-FOA) mailed Jan. 7, 2014, for U.S. Appl. No. 13/017,704 Title: Three-dimensional ordered diamond cellular structures and method of making the same, filed Jan. 31, 2011, Inventor Christopher S. Roper et al.
USPTO Advisory Action (AA) mailed Apr. 17, 2014, for U.S. Appl. No. 13/017,704 Title: Three-dimensional ordered diamond cellular structures and method of making the same, filed Jan. 31, 2011, Inventor Christopher S. Roper et al.
Supplemental Response filed May 7, 2014 to USPTO Final Office Action (R-Suppl_116_FOA) mailed Jan. 7, 2014 and Advisory Action mailed Apr. 17, 2014, for U.S. Appl. No. 13/017,704 Title: Three-dimensional ordered diamond cellular structures and method of making the same, filed Jan. 31, 2011, Inventor Christopher S. Roper et al.
USPTO Advisory Action Examiner-Initiated Interview Summary (AA_INT-SUM) mailed May 20, 2014 for U.S. Appl. No. 13/017,704 Title: Three-dimensional ordered diamond cellular structures and method of making the same, filed Jan. 31, 2011, Inventor Christopher S. Roper et al.
Christopher S. Roper, et al., U.S. Appl. No. 13/300,543, Title: Optical components from micro-architected trusses, filed Nov. 18, 2011.
USPTO Non-Final Office Action (NFOA01) mailed Jun. 14, 2013 for U.S. Appl. No. 13/300,543, Title: Optical components from micro-architected trusses, filed Nov. 18, 2011, Inventor Christopher S. Roper, et al.
Response filed Sep. 16, 2013 to USPTO Non-Final Office Action (R-NFOA01) mailed Jun. 14, 2013 for U.S. Appl. No. 13/300,543, Title: Optical components from micro-architected trusses, filed Nov. 18, 2011, Inventor Christopher S. Roper, et al.
USPTO Non-Final Office Action (NFOA02) mailed Nov. 13, 2013 for U.S. Appl. No. 13/300,543, Title: Optical components from micro-architected trusses, filed Nov. 18, 2011, Inventor Christopher S. Roper, et al.
Response filed Apr. 14, 2014 to USPTO Non-Final Office Action (R-NFOA02) mailed Nov. 13, 2013 for U.S. Appl. No. 13/300,543, Title: Optical components from micro-architected trusses, filed Nov. 18, 2011, Inventor Christopher S. Roper, et al.
USPTO Applicant Initiated Interview Summary (INT-SUM) mailed Dec. 6, 2012 for U.S. Appl. No. 12/691,322, Title: Microtruss based thermal plane structures and microelectronics and printed wiring board embodiments filed Jan. 21, 2010 by William B. Carter, et al.
USPTO Notice of Allowance (NOA) mailed May 9, 2014 for U.S. Appl. No. 12/691,322, Title: Microtruss based thermal plane structures and microelectronics and printed wiring board embodiments filed Jan. 21, 2010 by William B. Carter, et al.
Supplemental Response filed Jun. 9, 2014 to USPTO Final Office Action (R-Suppl_1_114_FOA) mailed Jan. 7, 2014 for U.S. Appl. No. 13/017,704 Title: Three-dimensional ordered diamond cellular structures and method of making the same, filed Jan. 31, 2011, Inventor Christopher S. Roper et al.
USPTO Non-Final Office Action (NFOA03) mailed Jun. 24, 2014, for U.S. Appl. No. 13/017,704 Title: Three-dimensional ordered diamond cellular structures and method of making the same, filed Jan. 31, 2011, Inventor Christopher S. Roper et al.
USPTO Final Office Action (FOA) mailed Jun. 4, 2014 for U.S. Appl. No. 13/300,543, Title: Optical components from micro-architected trusses, filed Nov. 18, 2011, Inventor Christopher S. Roper, et al.
USPTO Notice of Allowance (NOA02) mailed Aug. 18, 2014 for U.S. Appl. No. 12/691,322, Title: Microtruss based thermal plane structures and microelectronics and printed wiring board embodiments filed Jan. 21, 2010 by William B. Carter, et al.
Response to USPTO Non-Final Office Action (R-NFOA03) mailed Jun. 24, 2014 filed Nov. 24, 2014 for U.S. Appl. No. 13/017,704 Title: Three-dimensional ordered diamond cellular structures and method of making the same, filed Jan. 31, 2011, Inventor Christopher S. Roper et al.
USPTO Final Office Action (FOA) mailed Jan. 23, 2015 for U.S. Appl. No. 13/017,704 Title: Three-dimensional ordered diamond cellular structures and method of making the same, filed Jan. 31, 2011, Inventor Christopher S. Roper et al.
USPTO Final Office Action (R-FOA) mailed Jun. 4, 2014 filed Nov. 11, 2014 for U.S. Appl. No. 13/300,543, Title: Optical components from micro-architected trusses, filed Nov. 18, 2011, Inventor Christopher S. Roper, et al.
USPTO Notice of Allowance (NOA) mailed Nov. 24, 2014 for U.S. Appl. No. 13/300,543, Title: Optical components from micro-architected trusses, filed Nov. 18, 2011, Inventor Christopher S. Roper, et al.
Amendment after Notice of Allowance (1_312_Amendment) filed Nov. 14, 2014 for U.S. Appl. No. 12/691,322, Title: Microtruss based thermal plane structures and microelectronics and printed wiring board embodiments filed Jan. 21, 2010 by William B. Carter et al.
Response to USPTO FOA (1_114_R-FOA02) mailed Jan. 23, 2015 filed Jul. 23, 2015 for U.S. Appl. No. 13/017,704, Title: Three-dimensional ordered diamond cellular structures and method of making the same, filed Jan. 31, 2011, Inventor Christopher S. Roper et al.

* cited by examiner

MICROTRUSS BASED THERMAL HEAT SPREADING STRUCTURES

CROSS REFERENCE TO RELATED APPLICATIONS

The present application is related to U.S. application Ser. No. 12/691,322, entitled MICROTRUSS BASED THERMAL PLANE STRUCTURES AND MICROELECTRONICS AND PRINTED WIRING BOARD EMBODIMENTS, by Carter et al., filed on a date even herewith, incorporated by reference in its entirety.

BACKGROUND

Current heat pipe structures have several disadvantages: they are generally too big (>2-3 mm in minimum dimension); they are not typically designed to provide a structural function (typically made out of hollow copper or aluminum annealed for good thermal property); and they are constructed with non-optimal cross sections for wide insertion into conformal applications. Typical cross sections include circular or square, but never <1 mm thick and >10 cm wide.

Heat transfer in consumer electronics, avionics, or satellite electronics, for example, and other known heat transfer applications, requires an efficient and scalable means. For example, as the operational speed of electronic components increases and their size decreases the need for a compact efficient means of heat removal is essential. Marked reduction in device junction temperatures as well as the spread in device temperatures is key to improving system performance and reliability. Thus, as microelectronic system power densities and performance requirements continue to increase, thermal management continues to present significant performance and design barriers. Although current PWB technology provides excellent electrical interconnectivity and controlled impedance RF lines, it presents significant thermal performance and CTE mismatch limitations. Current heat pipes have the ability to transfer large amounts of heat but are thermally distant from the heat sources. Further, in other applications such as space bound electronics, not only is size critical, but also weight.

Not only the specific electronics fields above, but also many other electronic and non-electronic related areas, face similar issues, and more, in applying conventional heat pipe technology.

Thus, several long-felt needs exist. What is needed is a way to enable robust heat spreading structures by imparting not only a thermal function (via heat transport through the vapor) but also a structural function. Further, what is needed is a mechanically efficient, lightweight structure that can be handled during manufacture, and can survive high-g shock during use in a range of demanding applications. Also, what is needed is fabrication using a flexible method that enables comformability, net-shape manufacture, and spatial adjustment of the wick density and vapor chamber geometry to optimize thermal transfer.

SUMMARY

In one possible implementation, a heat transport structure is provided having a structural microtruss wick with a thermal transport medium associated with the microtruss wick for thermal energy transport by fluid and vapor between a heat source and a heat sink.

BRIEF DESCRIPTION OF THE DRAWINGS

The features and advantages of the present invention will be better understood with regard to the following description, appended claims, and accompanying drawings where:

DESCRIPTION

Figure 1:
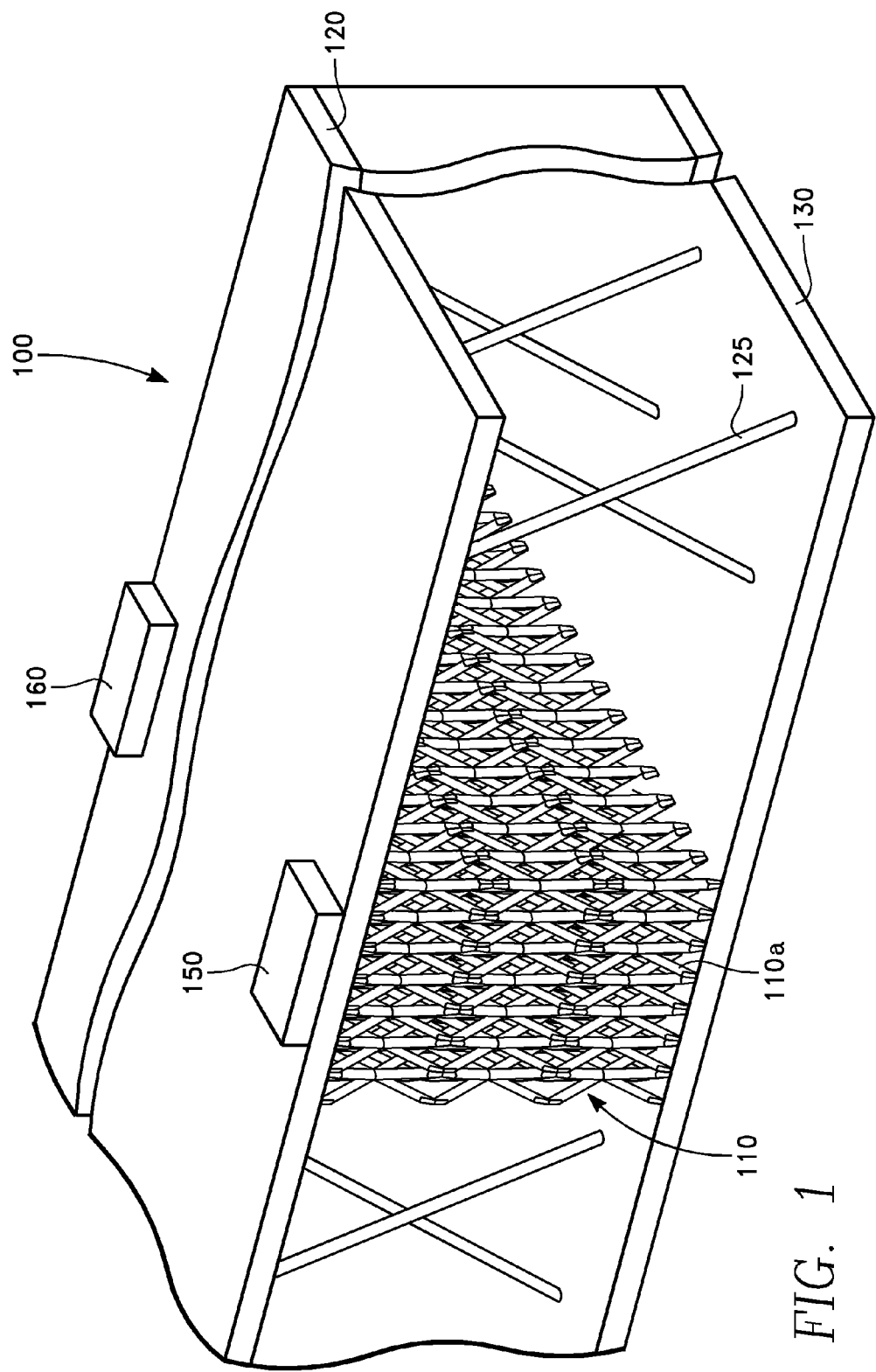
FIG. 1 shows a cut-away side view of a microtruss based thermal heat spreading structure.

FIG. 1 shows a cut-away side view of a microtruss based thermal heat spreading structure 100. In various embodiments, the microtruss based thermal heat spreading structure is a heat spreading structure with high lateral thermal transport based on flat heat pipe or vapor chamber related geometries that use a microtruss 110 for wicking and structural support, and lower density microtruss 125 for additional structural support and to facilitate vapor transport. The overall structure combines an ordered, open-cellular microtruss material 110 sandwiched between two faceplates surfaces 120 and 130 that may be flexible or rigid depending on constituent materials, and depending on an application requirements, may be either flat, or shaped to conform to a surface 120 or 130. The microtruss material 110 and 125 may partially, or completely occupy the area between the faceplate surfaces 120 and 130. The heat source(s) 150 and heat sink(s) 160 may be placed anywhere on one or both surfaces 120 and/or 125 of a structure 100. Mechanical stiffness and strength may be obtained by connecting the face sheets 120 and 130 of the structure 100 with the microtruss members 110 and 125 to form a robust mechanical structure with good stiffness-to-weight. Additional optional microtruss structures 125 may be included in some embodiments to provide additional stiffness or other desired characteristic. The spacing of microtruss 110 and 125 may vary according to wicking or vapor transport needs.

Mechanical stiffness and strength is obtained by connecting the face sheets 120 and 130 of the structure 100 with the microtruss structure 110 and/or optional reinforcing structural microtrusses 125 to form a robust mechanical structure 100 with good stiffness-to-weight. If the microtruss structure 110 are made of or coated with an appropriate elastic or tough plastically deformable material, then the overall structure 100 will exhibit reasonable durability, or other desired mechanical characteristic.

Thermal transport is accomplished in the structure 100 globally by fluid and vapor transport. Transfer of heat from/to the face sheets 120 and 130 into the liquid (not shown) is enabled either by forming the microtruss structure 110 out of highly thermally conductive material, or by coating a thermally insulating microtruss structure 110 with a highly thermally conductive material. If some or all of the members 110a of the microtruss structure 110 are made of or coated with an appropriate elastic or tough plastically deformable material, then the overall structure 100 will exhibit reasonable durability. Finally, either enabling liquid to wick along the microtruss member 110a surfaces or between neighboring microtruss members 110a that are spaced closely together accomplishes the wicking function of the microtruss structure 110. The former wicking mode is accomplished variously by: (1) coating a structural microtruss 110 with a thin porous medium, for example nanoparticle aggregate or porous metal or ceramic; (2) architecting the surfaces of the microtruss members 110a with fluid-wicking grooves; or (3) co-locating multiple parallel microtruss members 110a such that fluid will wick along the direction of the parallel microtruss members. The latter wicking mode is enabled when non-parallel microtruss members 110a are spaced closely so as to encourage fluid wicking through the array.

The microtruss 110 may serve three purposes: (1) conductive thermal transport across the faceplates into the working medium (not shown), (2) bridging the facesheets to provide mechanical stiffness and strength, and (3) wicking of a thermal transport medium inside the structure. Lateral thermal transport across the structure is accomplished by fluid and vapor transport. The resulting microtruss thermal wick may provide a high thermal conductivity, rigid, and strong microtruss structure 110. The microtruss 110 may include nanoscale coatings for super-hydrophilic surfaces.

Transfer of heat from/to the surface 120 or 130 of the structure 100 into the fluid is enabled either by forming the microtruss 110 out of highly thermally conductive material or by coating a thermally insulating microtruss with a highly thermally conductive material. In some embodiments, the heat may be transferred from a heat source 150 on a facesheet 120 on one side to an optional heat sink 160 on the facesheet 120 on the same side, or to a facesheet 130 on an opposite side, which may act as heat sink, or actually have a heat sink structure located thereon. In various embodiments, one or more heat source(s) can be on the same side as one or more heat sink(s). The heat source(s) and heat sink(s) can be on either side or on one side. For example, there could be 5 sources and 2 sinks on the top side and 3 sources and 4 sinks on the bottom side.

A heat pipe 1100, discussed further below with reference to FIG. 10, functions by transporting heat through phase transitions of the working fluid. At the hot region the fluid evaporates and the heat absorbed is determined by the amount of material vaporized and the enthalpy of vaporization of the working fluid. The vapor of the working fluid is transported to a condenser at the cold region due to a pressure difference in the structure. At the cold region condenser the vapor condenses and releases heat upon undergoing a phase change back to a liquid. The heat is radiated into a heat sink at the cold region. The fluid then travels in a wick back to the evaporator.

In some embodiments, the microtruss may function as a wick, the condenser, and/or the evaporator. When it functions as the evaporator, it will take heat from the heat source, such as a device case, on the hot side and transport it to the working fluid. When it functions as the condenser, it will collect heat from the condensing vapor of the working fluid for transport to the heat sink. When it functions as a wick, the microtruss transports the fluid from the condenser to the evaporator.

High efficiency wicking can be accomplished either by enabling liquid to wick along the microtruss member 110a surfaces or between neighboring microtruss members 110a that are spaced closely together. The former wicking mode may be accomplished, for example, by: (a) coating a structural microtruss 110a with an appropriate thin porous medium (not shown), for example a nanoparticle aggregate or porous metal or ceramic; (b) architecting the surfaces of the microtruss members 110a with fluid-wicking grooves (not shown); or (c) co-locating multiple parallel (not shown) microtruss members 110a such that fluid will wick along the direction of the parallel (not shown) microtruss members 110a. The latter wicking mode is enabled when non-parallel microtruss members 110a are spaced closely so as to encourage fluid wicking through the microtruss array 110.

A wick transports fluid through capillary forces. The capillary force is:

$$\Delta P = 2\sigma^* \cos \theta / r$$

Where $\sigma$ is the surface tension of the working fluid, $\theta$ is the contact angle between the fluid and the wick, and r is the radius of the pores or features in the wick. In order for the wick to transport fluid, the capillary force should be greater than gravity or any other force on the fluid.

The form of the microtruss can affect two parameters in the above equation. First, the smaller pores increase capillary pressure. The radius of the pores may be determined by controlling the space between members or struts in the microtruss. Additionally, a nanostructured or microstructured coating may be applied to the microtruss. The space between features in the coating will determine the effective radius of the pores. Thus fluid may flow through the microtruss or just along its surface.

Second, it is possible to change the surface of the wick to enable better wetting by a working fluid. By changing the surface polarity of the wick to a polarity near the working fluid, the contact angle will go to zero and the capillary pressure will be maximized which will result in more efficient fluid transfer through the wick. Examples of treatment chemicals to change surface polarity are silanes and polymers. Additionally, applying a layer of metal or ceramic on the surface of the scaffold may also be used to change the surface polarity. Metals such as Ni, Cu, Au, Ag, Pt, or any other plated or deposited metal and ceramics such as SiOC, SiC, $Si_3N_4$, HfC, $Cr_3C_2$, $B_4N$, BN (cubic or hexagonal), $Al_2O_3$, $TiB_2$, TiN, $ZrO_2$, $RuO_2$, and $TiB_2$ may be applied to the wick to alter surface polarity. An example of the advantage of surface modification is if the wick surface is made hydrophilic, then water, which is one of the best heat transfer fluids, may be used and this will maximize heat transfer through the heat pipe structure.

The last parameter $\sigma$, the surface tension of the working fluid, will be affected by the choice of the fluid and the requirements of the system. In all cases a fluid that has the greatest surface tension and the lowest contact angle on the wick is desirable. Physical constants for candidate heat transfer fluids are shown in Table 1:

TABLE 1

Potential Working Fluids for the Invention

| Working Fluid | Boiling Point (° C.) | Melting Point (° C.) | Surface Tension (mN/m) | Heat of Vaporization (kJ/mol) | Dielectric Constant |
|---|---|---|---|---|---|
| Methanol | 65 | −98 | 23 | 35.3 | 33 |
| Ethanol | 78 | −114 | 22 | 38.6 | 24 |
| n-Propanol | 97 | −127 | 24 | 41.2 | 20 |
| Water | 100 | 0 | 73 | 40.7 | 80 |
| Toluene | 110 | −93 | 28 | 35.7 | 2.4 |
| Pyridine | 115 | −42 | 38 | 37.3 | 12.5 |
| Ethylene Glycol | 197 | −13 | 47 | 53.2 | 37 |

For a fluid to be useful, the boiling point should be below the maximum heat source temperature, the melting point should be above the minimum heat sink temperature, a large heat of vaporization results in greater heat transfer, and the dielectric constant, which describes solvent polarity, should be appropriate for the wick. A high dielectric constant indicates a very polar liquid that wets hydrophilic surfaces and a zero dielectric constant indicates a non-polar liquid that wets hydrophobic surfaces. Based on the system requirements an appropriate fluid will be chosen.

Creating azeotropes (solutions with identical vapor and gas phase compositions) of the working fluids enables tuning of the boiling point to match the heat source temperature and tuning of the dielectric constant to maximize capillary pressure through better wetting of the wick surface. The dielectric constant will be the weighted average of the components, thus azeotropes will allow the use high surface tension liquids such as water and pyridine in solutions with less polar liquids to wet less polar wick surfaces. Examples of proposed azeotropes with dielectric constants different from the constituent fluids are shown in Table 2.

TABLE 2

Embodiment of Azeotropes for Working Fluids in the Invention

| Azeotrope (mol %) | Boiling Point (° C.) |
|---|---|
| 81% Ethanol + 19% Toluene | 77 |
| 57% Water + 43.3% Propanol | 88 |
| 75% Toluene + 25% Pyradine | 110 |

More than 18000 possible azeotropes exist and those in Table 2 are examples and not inclusive of all possibilities.

Fabrication

In one possible implementation, scalable lithography technique to fabricate highly-ordered three-dimensional cellular materials with a microtruss architecture. The open-cellular polymer microtruss structures can be converted to various other materials, such as metals or ceramics, utilizing established processes while still maintaining the originally designed polymer structure. This process is based on the three-dimensional patterning of self-forming, self-propagating polymer waveguides, or fibers. Unlike any existing lithography process, these high aspect ratio polymer fibers, which maintain an approximate constant cross-section over their entire length, can be "grown" from a single point exposure of light in a suitable photo-monomer without the effects of light diffraction. The polymer fibers are the building blocks of our ordered three-dimensional open cellular materials. By simultaneously forming an interconnected array of these fibers in three-dimensions and removing the uncured monomer, it is possible to rapidly form unique three-dimensional microstructures. As shown in FIG. 1, a three-dimensional ordered microtruss structure 110, for example, may include a plurality of first truss members defined by a plurality of first self-propagating polymer waveguides and extending along a first direction, a plurality of second truss members defined by a plurality of second self-propagating polymer waveguides and extending along a second direction, and a plurality of third truss members defined by a plurality of third self-propagating polymer waveguides and extending along a third direction. The first, second, and third truss members interpenetrate each other at a plurality of nodes to form a continuous material with the three-dimensional ordered microstructure. Because the process itself affords great flexibility and control of the fiber angle, diameter, and spatial location, the microstructure can be specifically designed to closely match theoretically determined ideal wicking architectures.

For example, an ordered three-dimensional polymer microtruss structure from a single exposure (lasting <1 min) may be fabricated with a single two-dimensional mask utilizing multiple collimated beams. The structures may be made with a range of repeating unit cell feature sizes. The minimum thickness is dependent only on sufficient interconnection between the microtruss members to enable the microstructure to be self-supporting and can be reduced to <1 mm as the feature sizes decrease. Such microtruss architectures may be created using self-forming optical fibers utilizing collimated UV light from a mercury arc lamp. Thinner polymer microtruss members (<10 μm) can be formed using higher intensity light, such as from a pulsed excimer laser.

One potential benefit of starting with a polymer microtruss wicking material and converting it to a suitable wicking material is net shape manufacturing. Prior to any material conversion, the polymer itself is flexible and can conform to different surfaces. This shape can be "locked-in" with a post-cure heat treatment and subsequent material coating, etc. can be done on the shaped structure.

Polymer microtruss fabrication is discussed in U.S. patent application Ser. No. 11/580,335, filed Oct. 13, 2006, (Invention Disclosure #060601), by Jacobsen, entitled OPTICALLY ORIENTED THREE-DIMENSIONAL POLYMER MICROSTRUCTURES, herein incorporated by reference, which describes a new technique to fabricate polymer materials with an ordered three-dimensional (3D) microstructure. Materials conversion options from the polymer microstructures are discussed in U.S. patent application Ser. No. 12/008,479, filed on Jan. 11, 2008 (Invention Disclosure #061105), entitled: COMPOSITE STRUCTURES WITH ORDERED 3D CONTINUOUS INTERPENETRATING PHASES, herein incorporated by reference, describes a composite material structure where at least one of the materials is or is derived from an ordered three-dimensional pattern of polymer optical waveguides and where the combination of multiple, yet distinguishable materials creates a new material system with bulk physical properties unlike the physical properties of its constitute materials. This new composite structure may have a continuous, interpenetrating network of at least two distinguishable materials where at least one of the materials maintains an ordered truss-like structure. The materials may include any combination of a polymer, ceramic, carbon and/or metal. Also relevant is U.S. patent application Ser. No. 12/075,033 filed Mar. 6, 2008, entitled: COMPOSITE FOR THERMAL STORAGE AND HEAT EXCHANGE, by Gross et al., herein incorporated by reference, which is a composite material that may function as a heat storage unit, a heat battery, or a heat exchanger. The material has two parts, one is a supporting scaffold and the other is a material to store thermal energy. Various embodiments may be composed of an optically templated polymer, graphite, or metal scaffold filled with a solid or liquid that will store heat. The composite may be used as a weight or force bearing part of a structure rather than current heat storage units that are not supporting components of a structure. Thermal energy may be stored by changing the temperature of the heat storage material or by the heat storage material undergoing a phase change.

Microtruss Based Thermal Ground Plane Structure for Microelectronics Applications and Printed Wiring Board Implementations In various embodiments, microtruss wicks 110 may reinforce integrated facesheets 120 and 130, such as thermally matched face sheets components, and form Thermal Ground Plane or TGP structures that simultaneously maximize thermal performance, durability, and reliability, integrated within a larger structure such as Printed Wiring Board or Printed Circuit Board, referred to herein a PWB. The fabrication process enables tailoring of the TGP by specifying the spatial pattern and size of microtruss structures across large areas to rout and remove waste heat as easily as signals and power are currently managed using state-of-the-art PWB technology. In various embodiments, the TGP structures are completely compatible with PWB processing, and integrating the two technologies will allow microelectronics systems with dramatic volume and weight reduction, improved efficiency, and increased physical architecture design freedom.

The TGP structure may contain features of a structurally reinforced heat spreading structure of FIGS. 1-10. Referring to FIG. 1, in various embodiments, waste heat from an IC or other heat source 150 is continually conducted into a fluid (not shown) via a continuous microtruss 110 wick, carried by vapor transport, and rejected at a heat sink 160, with fluid returning through the wick for continuous cooling. Two face sheets 120 and 130 are bridged by spatially defined high strength, high thermal conductivity microtruss wick structure 110. Microtruss structure 110 and optional reinforcing microtruss 125, bridge the facesheets 120 and 130 providing mechanical stability, rigidity, flexibility, or other desired characteristic, depending on the application. An optional diffusion-bonded or coating-based seal 490 (FIG. 4) around the edges of the structure can ensure hermeticity. Wicking occurs between arrays of closely-spaced microtruss members 415 and/or along the surfaces of hollow structural microtruss members 425.

Fluid wicking may be maximized by adjusting microtruss member 110a spacing and geometry to produce simultaneously high wicking pressures and high fluid flow. Employing nanoporous super-hydrophilic coatings will maximize fluid-surface interface tension. Fluid parameters such as viscosity, surface tension and working temperature will be adjusted using azeotropes and engineered fluids. Various fabrication implementations allow arbitrary definition of the wick structure with designs optimized either for heat sources and sinks in particular places on the TGP surface or structured for generic placement. The hermetically sealed structure of the TGP, which houses a completely passive, thermal gradient driven liquid/vapor transport system with no moving parts, ensures that TGP-based cooling systems will offer long term reliability and survivability.

In some embodiments, in addition to having high performance, TGPs may be electrically, structurally and architecturally compatible with modern PWB technology. In various embodiments, the TGP structure will put substantial heat transfer capability only an IC bond line away from high power density devices, provide increased design freedom to locate these devices, and be considerably more effective in reducing device temperatures and differences between device array components/elements than current heat management techniques.

Successful insertion of the TGP technology is facilitated by compatibility with current microelectronic materials and practices. As discussed above, current PWB technology provides excellent electrical interconnectivity and controlled impedance RF lines but presents significant thermal performance and CTE mismatch limitations. Various embodiments of the TGP provide excellent thermal conductivity and CTE capabilities. It is feasible to seamlessly merge the TGP and appropriate PWB technologies, and in doing so allow for new system designs featuring smaller size, lower weight and novel configurations with improved system performance.

The wick consists of a high surface area, open-celled structure designed to transport the working fluid via capillary action: as vapor leaves the evaporator and condenses at the cold region of the TGP, the wick continually forces the liquid back towards the evaporator. Additionally, the wick should be capable of quickly transporting all of the working fluid in the evaporator to the hottest regions of the heat pipe. The simultaneous needs for high capillary pressure and high fluid mobility throughout the evaporator often require wicks of different forms, and the ultimate performance of the wick will depend on several design parameters, including the material choice, overall structural geometry, thickness, pore size and spacing, and surface treatments or coatings. Proper optimization of these parameters, in turn, will depend on the physical and chemical properties of the working fluid, including its viscosity, density, conductivity, temperature, and polarity.

In some embodiments, an important factor in wick design will be simultaneously optimizing wicking pressure and fluid flow. Although the maximum capillary head generated by a wick will increase with decreasing pore size, the smaller size will decrease fluid mobility throughout the wick. In order for these structures to operate efficiently as a wick, particularly when under the influence of external acceleration, the material should generate a sufficient capillary pressure to drive the working fluid from the condenser section back to the evaporator. This pressure, $\Delta P$, is dependent on the solid-vapor ($\gamma_{SV}$) and solid-liquid ($\gamma_{SL}$) interfacial energies and pore radius, r, through a modified LaPlace—Young's Equation: $\Delta P=2(\gamma_{SV}-\gamma_{SL})/r$. Thus, to drive a fluid into the wick, the wick pore diameter, r, and the interfacial energy, $\gamma_{SL}$ should be minimized (the fluid should wet the wick) to drive fluid flow against gravitational forces. Reducing pore size, however, will lead to an increase in fluid flow resistance, generally quantified by the wick permeability, $C\sim r^2$ (C is proportional to $r^2$). Thus, decreasing pore sizes will reduce the volumetric flow rate and hence drastically limit the heat removal capability of the TGP. A range of microtruss geometries with effective wick pore structures that globally maximize conductive heat transport into the fluid, fluid flow rates from the condenser to the evaporator, and capillary head pressure are possible.

EXAMPLE WICK EMBODIMENTS

Enhanced Wick Thermal Conductivity

As in a flat heat pipe structure, thermal transport is accomplished in the structure globally by fluid and vapor transport. Forming the microtruss out of highly thermally conductive materials such as graphite, copper, aluminum, beryllium, magnesium, silver, gold, tungsten, molybdenum, silicon, diamond, boron nitride, and/or SiC, or the like, or their alloys, mixtures, or compounds, improves heat transfer from the face sheets into the liquid at the heat source regions. Relative to random porous structures or grooves, the design of the microtruss geometry can maximize the effective thermal conductivity of the wick. This is primarily due to the linear structure of the microtruss members, which minimize the path length between the face sheets (heat sources) and the working fluid, thereby increasing the effective thermal conductivity of the wick. With a 20-35% solid volume fraction, effective thermal conductivities can exceed 100 W/mK using candidate wick materials such as Cu, Ag, SiC and C (graphite). By using known values for CVD SiC and water (as the working fluid), the thermal conductivity of the wick can easily be varied from ~50 W/mK up to ~300 W/mK. With effective microtruss design, the effective thermal diffusion length from the face sheet into the fluid can be tailored from ~1 mm down to less than 5 microns.

High Fluid Wicking and Heat Flux Capability

Wick design can be used to control/facilitate high heat flux under a wide range of aggressive conditions, including high force, loading, acceleration, shock, and/or stress conditions. As length scales shrink, wicking pressure increases and wick permeability decreases. In a regular, repeating microtruss structure, however, both quantities can be maximized relative to random, open-celled porous (foam) media. The ability to properly size and arrange the microtruss into regular structure possessing both short and long range order should increase the permeability of the structure in comparison to random porous media, which in turn will allow more efficient wicking of the working fluid, and thus higher heat transfer rates.

Enhanced Wick Permeability

A comparison with Carman-Kozeny type permeability estimates for various configurations of microtruss-based wicks indicate potentially significant improvements over random (foam-like) architectures, with values potentially approaching the permeability of similar sized tubular channels. This performance results directly from the ability to engineer the internal structure of the microtruss to achieve both a high capillary pressure as well as the required flow rate through the wick through control over the permeability distribution. Microtruss materials can be used in wick designs, such as those used for traditional heat pipes where the wick is distributed across the facesheet, or more focused designs such as those shown in FIGS. 1 and 5, discussed below. While regular structures offer great improvements in permeability, it is possible to feasibly design and fabricate non-homogenous, or composite microtruss structures, such as those shown in FIGS. 5 and 6, discussed below, in order to improve permeability even more dramatically. For instance, incorporating long range open channels, shown in FIG. 5, within the wick can further reduce resistance to fluid flow, allowing for higher fluid transport rates, while maintaining small pore sizes in evaporator and condenser regions.

Figure 4:
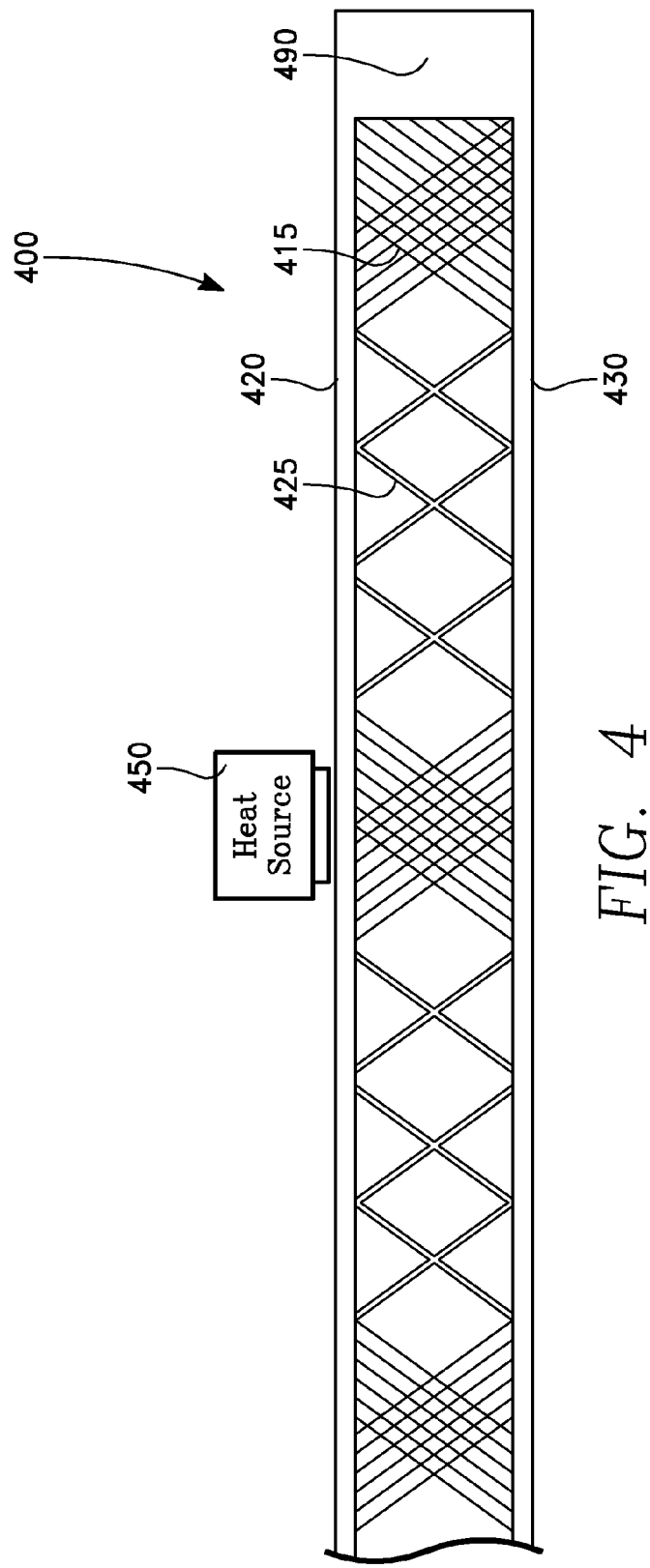
FIG. 4 shows a cross sectional side view of an embodiment of a heat pipe which contains two length scales of microtruss.

Achieving a desired heat flux capability may be possible using homogenous wick materials, with wick designs such as shown in FIG. 4, discussed further below. In some structures, higher permeabilities may be achievable in some embodiments, for example, such as by employing non-uniform wick designs such as those illustrated in FIGS. 6-8.

Enhanced Capillary Pressure and Wick Saturation

A uniform microtruss structure can dramatically increase wicking pressure in various embodiments. Such improvements arise because pore size variations no longer limit the effective wicking pressure; in random foam structures the percolation of larger sized pores becomes the limiting factor in wicking pressure. Due to the ordered nature the microtruss, pore size variation is essentially a non-issue, and therefore saturation of the wick can be improved under various conditions relative to similarly sized random porous structures.

Designing for Thermal Routing

Figure 10:
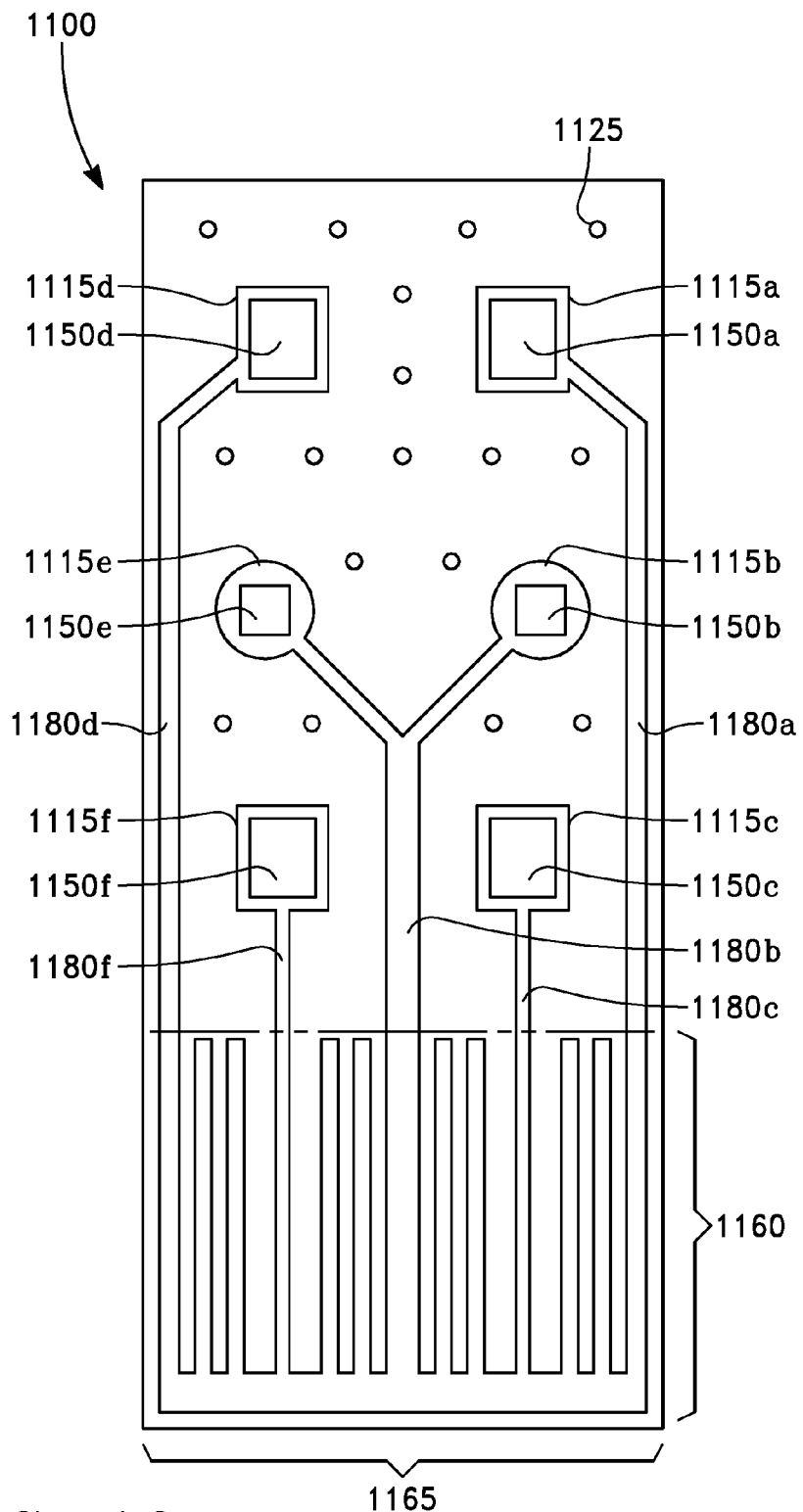
FIG. 10 shows a cross sectional top view of one possible embodiment of a heat pipe having multiple heat sources with separate fluid flow paths through microtruss wicks to each heat source from a condenser.

Varying the spatial structure of the wick, as shown in FIG. 10, can enable optimized heat spreading, higher tolerance to dryout, reduced barriers to startup, resistance to acceleration effects and wider operating temperatures. Specific or generic evaporator-adiabatic-condenser mass transport pathways can be defined according to application needs. In addition, the ability to form the microtruss structure and face sheets out of a wide range of materials permits the heat spreader to match the desired coefficient of thermal expansion (CTE) for improved reliability. Of particular advantage in some embodiments, is the ability to spatially pattern and/or vary the pore size of the microtruss structures to optimize wicking action in certain areas and optimize for low vapor flow resistance in other areas.

Integration with PWB Technology

Unlike traditional PWB technologies, various embodiments of the TGP can be designed to easily route and remove heat from an almost arbitrary range of heat source and sink placements. In various implementations, the TGP fabrication process is capable of seamless integrate with modern PWB technology, with similar flexibility in routing electrical power and signals. Integrating TGP technology with current PWB technology enables the greater flexibility for electronics design. Optical fabrication capability can simultaneously define feed-through vias and ground planes in addition to wick structures. The strength and robustness of the TGP will allow direct integration of PWB features using state-of-the-art composite bonding processes.

In some embodiments, multilayer layer PWB assemblies may be joined by bonding to the TGP, or by additive build up of interconnection layers directly on the TGP, or a combination of the two, to create highly functional interconnection-thermal assemblies ready for device attachment. In one embodiment, the TGP assembly would present a high thermal conductivity high electrical conductivity (ground) plane, for example facesheet 120 (FIG. 1), on which high power dissipating ICs would be mounted on one or both sides, i.e. facesheets 120 or 130 (FIG. 1). A PWB structure, e.g. a multilayer PWB with cutouts for the ICs, would be created on one or both sides of the TGP to provide electrical interconnection for the ICs and support the mounting and interconnection of passives, low power active devices, and provide a means for off-TGP interconnection. The TGP would present a low impedance ground or power plane for mounting ICs.

For this simplest TGP construction, front to back interconnection is at the TGP edges. For more demanding applications, front to back electrical (control, power, and RF) and optical interconnections could be arbitrarily placed anywhere on the TGP. Interconnection through the TGP structure is possible for applications where the wiring demand is relatively low, e.g. periodic coaxial phased array interconnection or power bus distribution, a TGP+PWB structure would provide an outstanding electrical and thermal physical design environment. In some embodiments, placing coaxial electrical interconnections between the front and back could consume wick or vapor channel volume that would otherwise be used for heat transfer. Moreover, these interconnect features may need to be introduced into the hermetical seal in some embodiments.

Figure 2:
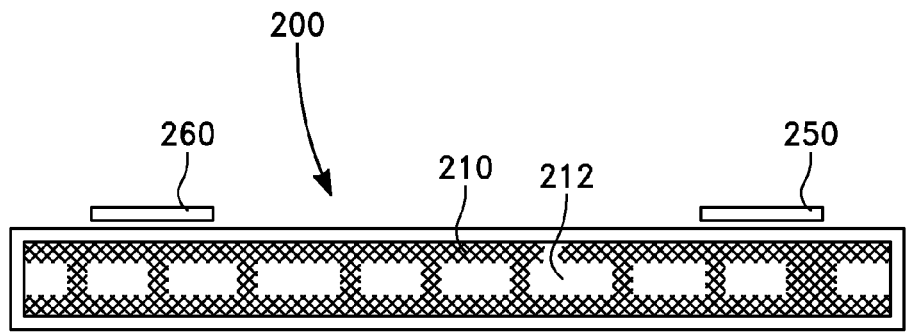
FIG. 2 is a cross sectional side view of an embodiment of a heat pipe which contains a microtruss that acts as a wick and as structural support.

In one example for comparison, a 1 mm thick TGP structure in the configuration of FIG. 2 was compared to an equivalently sized all copper conduction-only structure. Note that the all copper (k=400 W/m-K) structure is provided for benchmark purposes and is capable of substantially more heat removal capability than current PWB structures. The simulated TGP has 0.1 mm thick faceplates (k=400 W/m-K), 0.1 mm thick wicking layers (k=100 W/m-K), and a 0.6 mm thick vapor transport layer (k=20,000 W/m-K). Device level thermal spreading was not included in this simulation. The simulation clearly showed that the TGP can reduce heat source device 250 to heat sink 260 temperatures by 3 times and also can maintain <1 deg C. temperature difference between separated devices.

At first glance, the 3 times improvement in device to sink temperatures may not seem impressive, but it is important to consider the thermal transport limits imposed by the facesheet and wicking layers, which the heat travels through prior to reaching the vapor transport layer. Because vapor-phase heat transport is so high in a typical heat pipe, thermal performance will actually increase as lateral dimensions increase. The 1 mm thick planar form factor, with structural and thermal performance not achievable with today's PWB technology, would provide a significantly improved ability to drastically reduce the device temperatures. Due to the high heat spreading capability, the TGP structure also provides tight temperature control across and array of devices, which is a great advantage in systems where performance directly correlates with temperature variation across the array.

In some embodiments, traditional components of a heat pipe may be included, such as an evaporator where the working fluid vaporizes, a condenser where the working fluid condenses from a vapor into a fluid, and a wick that transports the working fluid from the condenser to the evaporator. Multiple length scales of microtrusses may be fabricated together in one heat pipe. A microtruss that supports the heat pipe structurally may be made with large spacing between microtruss members while a closely spaced microtruss may be fabricated at the condenser, evaporator and therebetween, to act as a wick.

The heat pipe and microtruss may be made of a polymer, metal, or ceramic. The heat-pipe may be made of a material that is matched to the coefficient of thermal expansion of the heat source. This reduces stress on the heat source and allows a soldered joint for maximized thermal transfer.

The following examples show potential heat spreading structure implementations containing microtruss in heat pipe embodiments. These are examples and not all possible embodiments of the invention.

FIG. 2 is a cross sectional side view of a heat pipe 200 which contains a microtruss 210 that acts as a wick and as structural support. Open volume or channels 212 exist in the heat pipe 200 that allow vapor to flow from the evaporator (not shown) to the condenser (not shown). Liquid flows in or on the microtruss 210. In some embodiments, the channels 212 may be formed by removing some microtruss material to form the channels 212, for example by cutting, drilling, milling, etc.

Figure 3:
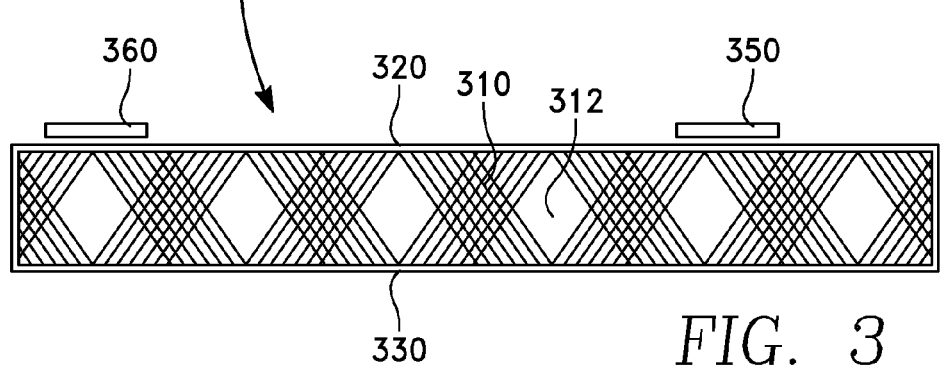
FIG. 3 shows a cross sectional side view of another embodiment with microtruss struts extend from the top surface to the bottom surface of the structural heat pipe.

FIG. 3 shows a cross sectional side view of another embodiment with microtruss struts extend from the top surface 320 to the bottom surface 330 of the heat pipe 300. The vapor channels will not be cut out of the microtruss structure 310; instead they will be defined with the mask for making the microtruss 310. In places where no holes in the mask exist, open spaces that act as vapor channels 312 will be formed. Holes in the mask will define struts that wick liquid and support the heat pipe 300.

As with the other embodiments, the microtruss heat pipe 300 of FIG. 3 may be filled with a working fluid that has a boiling point less that the temperature of the heat source 350. Additionally, as with the other embodiments, the heat sink 360 and heat source 350 may be placed on one face surface 320, as shown in FIG. 3, or both face surfaces 320 and 330 of the microtruss, and anywhere on either face surface 320 or 330, and there may be more than one heat source 350 or heat sink 360.

FIG. 4 shows a cross sectional side view of an embodiment of a heat pipe 400, which contains two length scales of microtruss 415 and 425. The narrow spaced microtruss 415 acts as a wick and the large spaced microtruss 425 allows increased vapor flow through the device 400 and provides structural support. Also, large spaced microtruss 425 can be larger diameter for increased stiffness and strain.

It is possible but not required that all microtruss structures 415 and 425 in this example embodiment are fabricated at once based on the spacing and diameters of holes in the mask. The microtruss heat pipe 400 may be filled with a working fluid that has a boiling point less that the temperature of the heat source 450. Additionally, the heat sink, which may be attached to one or more of the face surfaces 430 or 420. The heat sink may be the face sheet 430. The heat source 450 and heat sink may be placed on, or be on opposite sides 420 and 430, of the device 400. Further, there can be more than one heat source 450 or heat sink (not shown).

Figure 5:
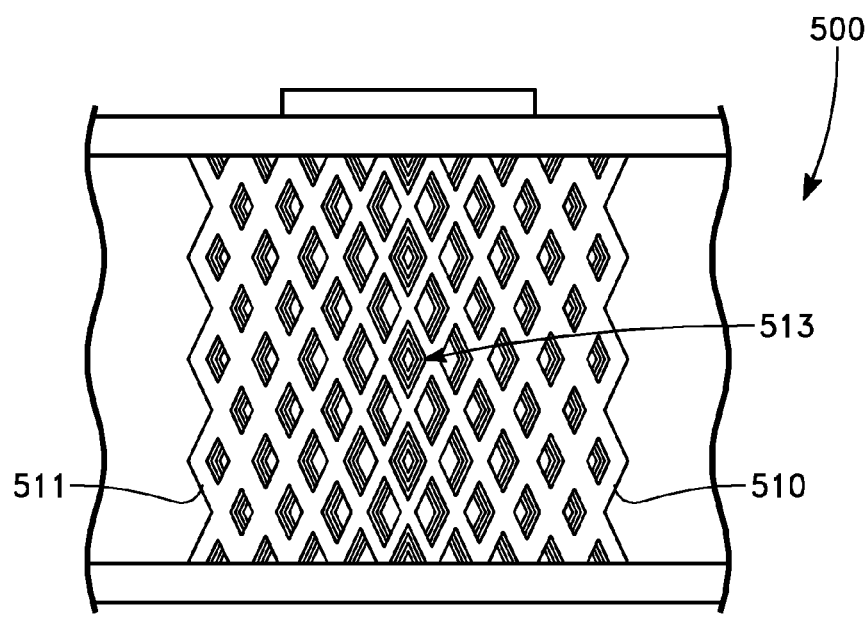
FIG. 5 shows a cross sectional side view of another embodiment of a composite wick, in a heat spreading structure.

FIG. 5 shows a cross sectional side view of another embodiment of a composite wick 500, in a heat spreading structure 500. In this embodiment 510, microtruss members 511 at an edge of the micro-truss wick 510 may be coated to reduce pore sized near vapor transport paths, leaving internal high flow regions 513 unobstructed to facilitate higher flow rates.

Composite microtruss wick designs such as shown in FIGS. 4 and 5 can enhance capillary wicking pressure and fluid flow, while maintaining high heat flux performance under high forces, loads, accelerations, shocks, and/or stresses. In such an application, the microtruss structures may be fabricated of SiC, for example.

Figure 6:
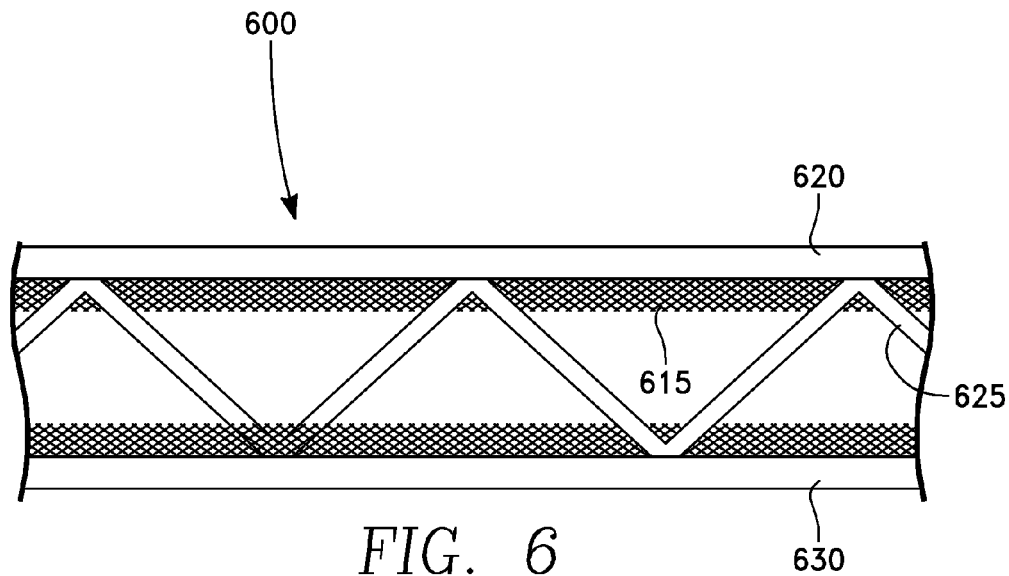
FIG. 6 shows a cross sectional side view of yet another embodiment of a heat spreading structure which contains two length scales of microtruss including hollow truss material allowing fluid flow to cross between faces.

FIG. 6 shows a cross sectional side view of yet another embodiment of a heat spreading structure 600 which contains two length scales of microtruss 615 and 625. The top and bottom face surfaces 620 and 630 are covered with a closely spaced microtruss 615 that acts as a wick for lateral fluid transport and may also act as the condenser and the evaporator. This allows evaporation of the working fluid at the evaporator and condensation of the working fluid at the condenser. The distance between the face surfaces 620 and 630 is bridged by a microtruss 625 that provides structural support and fluid flow between the face sheets.

In FIG. 6, the large spacing structural support microtruss 625 may be covered with a nano or meso structured material (not shown), have grooves or channels (not shown) in it, be made of hollow tubes 725 (FIG. 7), or be covered with a narrowly spaced microtruss 815 (FIG. 8) to allow fluid to flow along the surface from one side 630 of the heat spreading structure 600 to the other 620.

Figure 7:
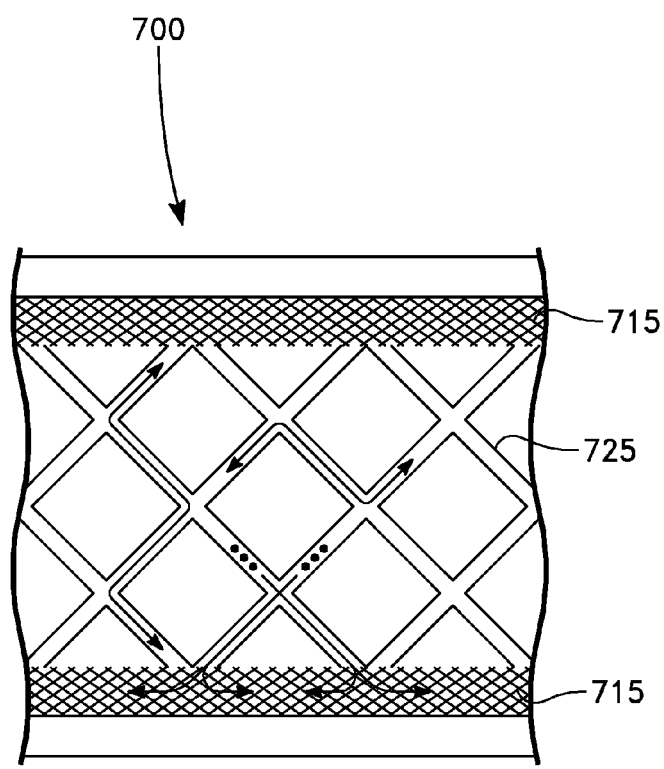
FIG. 7 shows a cut away side view of a microtruss heat spreading structure with two length scales of microtruss including hollow truss material for lateral and vertical fluid flow.

FIG. 7 shows a cut away side view of a microtruss heat spreading structure 700 with two length scales of microtruss 715 and 725. The large hollow microtruss 725 is used for structural support and to provide fluid transport through the structure inside the tubes. The narrow spaced microtruss 715 wicks fluid in the lateral direction and allows evaporation of the working fluid at the evaporator and condensation of the working fluid at the condenser. FIG. 7 shows how liquid could flow through a microtruss 725 with hollow struts, while FIG. 8 shows a structural micro-truss 825 covered with a narrower spacing wicking microtruss 815.

Figure 8:
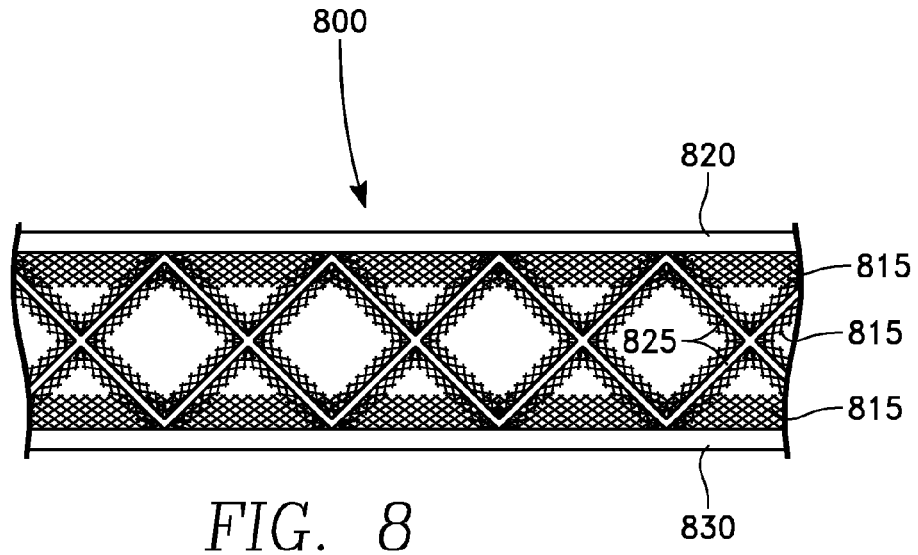
FIG. 8 shows a cross sectional side view of a microtruss heat spreading structure with two length scales of microtruss.

FIG. 8 shows a cross sectional side view of a microtruss heat spreading structure 800 with two length scales of microtruss 815 and 825. The large microtruss 825 provides structural support, while the narrow spaced microtruss 815 on the large microtruss 825 and on the face sheets 820 and 830 of the heat spreading structure 800 provide fluid transport through the heat spreading structure 800.

Figure 9:
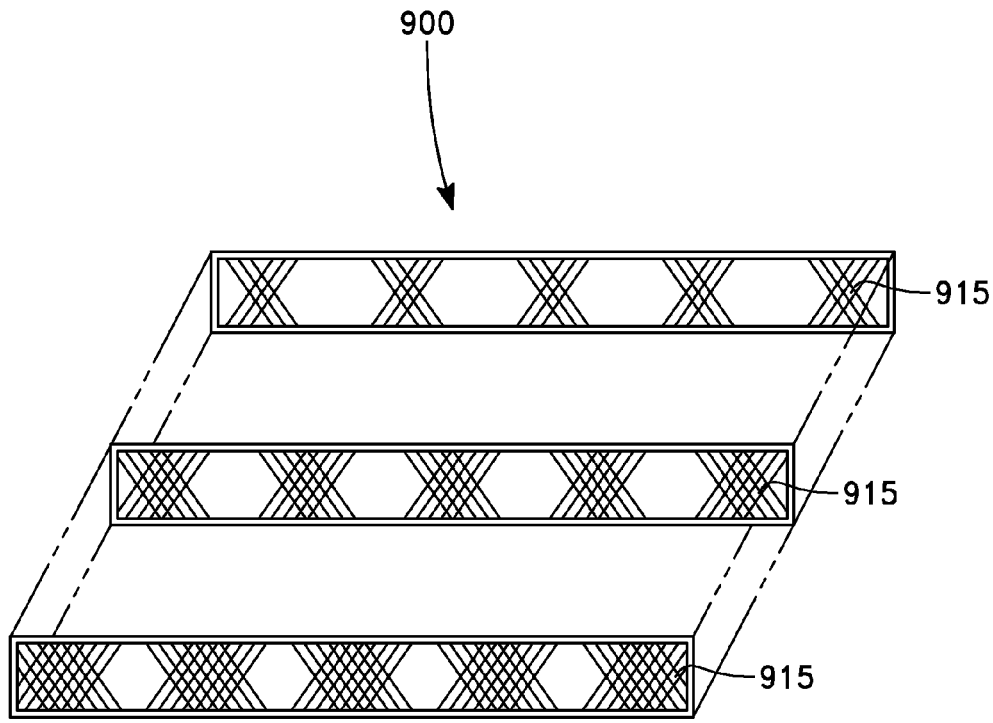
FIG. 9 shows an exploded view of a heat spreading structure intended to illustrate special variation in microtruss density.

FIG. 9 shows an exploded view of a heat spreading structure 900. The microtruss 915 density varies across the heat spreading structure 900 to provide more wicking material at the heat source (not shown) for (1) improved evaporation and (2) less material near the condenser (not shown) to save weight and improve vapor transport. The density of the microtruss 915 may vary continuously or in steps across the heat spreading structure 900.

The microtruss heat spreading structures discussed herein may be filled with a working fluid (not shown) that has a boiling point less that the temperature of the heat source (not shown). Additionally, the heat sink (not shown) and heat source (not shown) may be placed on one or both sides of a microtruss structure and anywhere on either face surface. Additionally, there can be more than one heat source (not shown) or heat sink (not shown). In various embodiments, the microtruss heat spreading structures discussed herein may be embodied as a heat pipe.

FIG. 10 shows a cross sectional top view of one possible embodiment of a heat pipe 1100 having multiple heat sources 1150a-f with separate fluid flow paths through microtruss wicks 1180a-d, &f to each heat source 1150 a-f from the condenser 1165. The heat pipe 1100 has with multiple heat sources 1150a-f and one heat sink area 1160. The microtruss density is varied in the heat pipe to direct fluid flow and allow better vapor transport.

In the condenser region 1165 the microtruss wick is arranged to maximize vapor return and condensation. The fluid return paths 1180a-d&f and individual evaporators 1115a-f are optimized for individual heat sources 1150a-f. Sparse microtrusses 1125 may be interspersed for structural stability, while dense microtrusses 1180a-d&f wick fluid from condenser 1165 to heat sources 1150a-f.

In various embodiments, such as a heat pipe, where there is different size microtruss in the wick and in the rest of the structure, the structural non-wick microtruss may have an aspect ratio (AR) that is in a range of from about 5 to about 20, and in some embodiments ideally in a range from about 8 to about 12, with a strut axial diameter (D) in a range from about 1 micron to about 1 mm, with some embodiments ideally being in a range from about 10 to about 500 microns. The wick microtruss may have an aspect ratio (AR) that is in a range of from about 5 to about 20, and in some embodiments ideally in a range from about 8 to about 12, with a pore size in a range from about 1 micron to about 1 mm, with some embodiments ideally being in a range from about 1 to about 100 microns, where pore size is give by L–D, which is equivalent to D*(AR−1) since AR~L/D (AR is proportional to L/D). The wick pore size calculation is a tradeoff between capillary pressure (small pores better) and hydrodynamic losses (small pores worse). The design equations for this trade off are known in the art, so the optimal pore size for a given working fluid, heat flux, and heat pipe length can be calculated.

Described herein are various heat spreading structures with high lateral thermal transport based on flat heat pipe or vapor chamber related geometries that may use microtruss structures for wicking and structural support. In various embodiments TGPs may have these features:

High thermal performance: 100× over copper alloys

Electronic and RF performance: Insulating or conducting electronic substrate, low dielectric loss shapes, many materials: Manufactured from SiC, Si, Cu, polymers in desired net-shape Lightweight, tough and stable: Low density (<1 gm/cc); robust and reliable; CTE matched Compatible with current practices: Seamless integration with modern PWB manufacturing The fabrication process enables the TGP to be tailored by specifying the spatial pattern and size of microtruss structures across large areas, thus routing and removing waste heat as easily as signals and power are currently managed, by using state-of-the-art printed wiring board (PWB) technology. In various embodiments the TGP structures are completely compatible with PWB processing, and integrating the two technologies will result in microelectronics systems with dramatic volume and weight reduction, improved efficiency, and increased physical architecture design freedom.

Various embodiments provide a thermal transport structure for effectively transporting heat away from a heat source while providing increased structural stability and enabling the use of a thermal transport fluid. In various embodiments, the very regular pore-like spacings formed by the structure of the microtruss will allow more efficient wicking of the working fluid and higher fluid transfer rates. The ability to provide a regular structure of the microtruss also enables high mechanical stiffness as well as increased applications.

Some of the potential applications that could utilize this new structure include:

Thin conformal heat pipe structures for electronics cooling, fuel cells, hydrogen storage containers, capacitor structures;

High friction/high wear surfaces (i.e. braking surfaces) where combination of mechanical strength and thermal extraction is highly desirable;

Heat dissipating circuit boards for mounting electronic chips;

Structural aircraft, missile, or vehicle skins where heat spreading to defeat external threats such as directed energy weapons may be required; and Cooling of passenger or military vehicles, clothing, temporary or permanent buildings or shelters with structural or non-structural skins by conducting daytime heat away from human-occupied areas to heat sinks or heat storage areas (such as the ground or nearby water sources).

These applications are enabled by microtruss that can be manufactured and molded into the shape desired. This will allow lower cost manufacturing, very thin heat pipes that will require less space, and greater thermal transport than in existing systems.

Satellites, missiles, and rotorcraft require better thermal control. Microprocessors are currently de-clocked in both satellites and missiles to reduce the thermal load. Improved heat removal will allow greater processing power. In satellites a more efficient heat pipe will allow use of a small radiator saving space and weight due to a greater cold side temperature. Better heat removal will allow greater damping capacity in helicopter lag dampers which will enable larger rotorcraft.

Hybrid and hydrogen powered vehicles require cooling. The power electronics in hybrids release significant heat and need to be cooled. Hydrogen fuel cells operate at 80 C and need the heat to be moved outside the engine compartment to be cooled by air flowing over the heat sink. Additionally, heat pipes molded into the roof of cars to transport heat to the underside of the vehicle this would allow power saving upon start up due to reduced initial air-conditioning needs.

The military requires greater capacity high power capacitors. When these capacitors are charged and discharged they release significant heat which degrades performance and reduces service life. Better cooling integrated into the capacitor would solve these issues.

Many other applications and embodiments are possible.

Having described this invention in connection with a number of embodiments, modification will now certainly suggest itself to those skilled in the art. The example embodiments herein are not intended to be limiting, various configurations and combinations of features are possible. As such, the invention is not limited to the disclosed embodiments, except as required by the appended claims.

What is claimed is:

1. A heat spreading structure comprising:
    a) a microtruss wick comprising an ordered three dimensional network of continuous interpenetrating microtruss members, the microtruss members constructed to transport fluid through capillary forces;
    b) wherein the plurality of microtruss members comprises at least two length scales of microtruss members comprising:
        (1) a first plurality of microtruss members;
        (2) a second plurality of microtruss members; and
        (3) wherein the second plurality of microtruss members are larger than the first plurality of microtruss members such that the first plurality of microtruss members are more closely spaced together than the second plurality of microtruss members;
    c) a thermal transport medium associated with the microtruss wick for thermal energy transport by fluid and vapor transport between a heat source and a heat sink;
    d) wherein the plurality of first microtruss members form first nodes, and wherein each of the plurality of first microtruss members forming the first nodes extends beyond the first nodes along a same direction so as to form other nodes with others of the plurality of first microtruss members, and wherein the second plurality of microtruss members form second nodes and change direction at each of the second nodes; and
    e) wherein the first plurality of microtruss members overlap a part of the second plurality of microtruss members.

2. The heat spreading structure of claim 1, wherein the microtruss wick is coated with a hydrophobic surface modification agent.

3. The heat spreading structure of claim 1, wherein the microtruss wick is coated with a hydrophyllic surface modification agent.

4. The heat spreading structure of claim 1, wherein the microtruss wick is coated with a surface modification agent comprising a metal.

5. The heat spreading structure of claim 4, wherein the metal comprises at least one of Ni, Cu, Au, Ag, or Pt.

6. The heat spreading structure of claim 1, wherein the microtruss wick is coated with a surface modification agent comprising a ceramic.

7. The heat spreading structure of claim 6, wherein the ceramic comprises at least one of SiOC, SiC, $Si3N_4$, HfC, $Cr_3C_2$, $B_4N$, BN, $Al_2O_3$, $TiB_2$, TiN, $ZrO_2$, or $TiB_2$.

8. The heat spreading structure of claim 1, wherein the microtruss wick is coated with a wicking aid.

9. The heat spreading structure of claim 8, wherein the wicking aid comprises a nanostructure coating.

10. The heat spreading structure of claim 8, wherein the wicking aid comprises a macrostructure coating.

11. The heat spreading structure of claim 1, wherein the microtruss wick comprises microtrusses comprising surface features.

12. The heat spreading structure of claim 11, wherein the surface features of the microtrusses comprise at least one of grooves or channels.

13. The heat spreading structure of claim 1, wherein the microtruss wick comprises at least one of the plurality of first or second microtruss members forming spaces between adjacent individual ones of the at least one of the plurality of first or second microtruss members, and wherein the thermal transport medium is located exterior to the individual ones of the at least one of the first or second microtruss members in the spaces between adjacent individual ones of the plurality of the at least one of the first or second microtruss members.

14. The heat spreading structure of claim 13, wherein the at least one of the first or second microtruss members are constructed to provide capillary wicking.

15. The heat spreading structure of claim 14, wherein the plurality of first or second microtruss members form a microtruss array, wherein the at least one of the plurality of first or second microtruss members forming spaces between adjacent individual ones of the at least one of the plurality of first or second microtruss members such that non-parallel ones of the at least one of the first or second microtruss members are spaced so as to cause fluid wicking through the microtruss array between adjacent ones of the plurality of the at least one of the first or second microtruss members.

16. The heat spreading structure of claim 15, wherein the microtruss wick is coated with a wicking aid.

17. The heat spreading structure of claim 15, wherein the microtruss wick comprises microtrusses comprising surface features.

18. The heat spreading structure of claim 16, wherein the surface features comprise at least one of grooves or channels.

19. The heat spreading structure of claim 14, wherein the plurality of interconnected microtrusses comprise hollow microtrusses.

20. The heat spreading structure of claim 1, wherein the microtruss wick comprises capillary spaces.

21. The heat spreading structure of claim 1, wherein the microtruss wick is constructed to support load.

22. The heat spreading structure of claim 1, wherein the thermal transport medium comprises a phase changing fluid such that the thermal transport medium transfers the thermal energy by evaporation and condensation.

23. The heat spreading structure of claim 1, wherein the microtruss wick is a conductive thermal transport of heat from the thermal source and the thermal transport medium.

24. A heat spreading structure comprising:
    a) a structural microtruss wick extending between a heat source and a heat sink, the structural microtruss wick providing support between surfaces of the heat spreading structure the structural microtruss wick comprising an ordered three dimensional network of continuous interpenetrating microtruss members, the microtruss members constructed to transport fluid through capillary forces;
    b) a thermal transport medium associated with the structural microtruss wick for transport of thermal energy by fluid and vapor transport; and
    c) wherein the ordered three dimensional network of continuous interpenetrating microtruss members comprises a plurality of first microtruss members forming a first node, and wherein each of the plurality of first microtruss members forming the first node extend in a same direction beyond the first node to form other nodes with other first microtruss members and comprising a plurality of second microtruss members forming second nodes and wherein the plurality of second microtruss members change direction at each node, wherein the microtruss wick comprises two length scales of microtruss such that the second plurality of microtruss members are larger than the first plurality of microtruss members such that the first plurality of microtruss members are more closely spaced together than the plurality of second microtruss members, wherein the first plurality of microtruss members overlap a part of the second plurality of microtruss members.

25. The heat spreading structure of claim 24, wherein the heat spreading structure comprises a vapor transport path adjacent the microtruss wick.

26. The heat spreading structure of claim 24, wherein the heat spreading structure comprises a vapor transport path extending through a non-wicking central region of the structural microtruss wick.

27. The heat spreading structure of claim 24, wherein the structural microtruss wick comprises a non-uniform distribution within the thermal plane structure.

28. The heat spreading structure of claim 27, wherein the structural microtruss wick comprises a higher density near a thermal source and a lower density near a thermal sink.

29. The heat spreading structure of claim 27, wherein the structural microtruss wick comprises a higher density near a periphery of the microtruss wick and a lower density near a center of the microtruss wick.

30. The heat spreading structure of claim 24, wherein the structural microtruss wick comprises different length microtruss members.

31. A heat spreading structure comprising:
    a) a microtruss wick comprising an ordered three dimensional network of continuous interpenetrating microtruss members, the microtruss members constructed to transport fluid through capillary forces;
    b) a thermal transport medium associated with the microtruss wick for thermal energy transport by fluid and vapor transport between a heat source and a heat sink;
    c) wherein the continuous interpenetrating microtruss members comprise hollow microtrusses comprising substantially circular cross sections, the hollow microtrusses being interconnected with each other so as to form a continuous hollow space extending therebetween, within the hollow microtrusses, the hollow microtrusses being sized so as to be capable of capillary wicking without additional wicking structures within the hollow microtrusses; and
    d) wherein the plurality of microtruss members comprises at least two length scales of microtruss members comprising:
       (1) a first plurality of microtruss members;
       (2) a second plurality of microtruss members;
       (3) wherein the second plurality of microtruss members are larger than the first plurality of microtruss members such that the first plurality of microtruss members are more closely spaced together than the second plurality of microtruss members;
       (4) wherein the plurality of first microtruss members form first nodes, and wherein each of the plurality of microtruss members forming the first nodes extend beyond the first nodes along a same direction so as to form other nodes with others of the plurality of first microtruss members, and wherein the second plurality of microtruss members form second nodes and change direction at each of the second nodes; and
       (5) wherein the first plurality of microtruss members overlap a part of the second plurality of microtruss members.

* * * * *